United States Patent [19]

Yoshida

[11] 4,042,944

[45] Aug. 16, 1977

[54] MONOSTABLE MULTIVIBRATOR

[75] Inventor: Tadao Yoshida, Tokyo, Japan

[73] Assignee: Sony Corporation, Tokyo, Japan

[21] Appl. No.: 571,792

[22] Filed: Apr. 25, 1975

[30] Foreign Application Priority Data

May 7, 1974  Japan .................. 49-50515

[51] Int. Cl.² .................. 357 34; H01L 29/78
[52] U.S. Cl. .................. 357/23; 307/264;
307/273; 307/304; 357/34; 357/89
[58] Field of Search .................. 357/23, 89, 34;
307/264, 273, 304

[56] References Cited

U.S. PATENT DOCUMENTS

| 3,204,160 | 8/1965 | Sah | 357/23 |
|---|---|---|---|
| 3,289,009 | 11/1966 | Gruodis | 357/23 |
| 3,382,375 | 5/1968 | Dischert | 307/273 |
| 3,397,326 | 8/1968 | Gallagher et al. | 357/43 |
| 3,407,313 | 10/1968 | Steadson | 307/273 |
| 3,513,333 | 5/1970 | Andersen | 307/273 |
| 3,727,082 | 4/1973 | Codina | 307/273 |
| 3,836,797 | 9/1974 | Steen | 307/273 |

FOREIGN PATENT DOCUMENTS 906,036  9/1962  United Kingdom .................. 357/89

Primary Examiner—Michael J. Lynch
Assistant Examiner—Joseph E. Clawson, Jr.
Attorney, Agent, or Firm—Hill, Gross, Simpson, Van Santen, Steadman, Chiara & Simpson

[57] ABSTRACT

A monostable multivibrator having a novel four terminal semiconductor device with a generally V-shaped emitter grounded current amplification characteristic. Means are provided to bias the operation of the device to a low point on the characteristic, to provide a trigger signal to the base of the semiconductor device for placing the device in a conducting state and, through the operation of a capacitor coupled between the gate and collector terminals, to shift the operation of the device to a high level on the emitter-grounded current amplification characteristic thereby sharply decreasing the output voltage obtained at the collector. Discharge circuit means are provided for the capacitor to gradually reduce the gate voltage and to shift the operation of the device back to the low circuit point thereby reducing the collector current and suddenly increasing the collector voltage.

5 Claims, 10 Drawing Figures

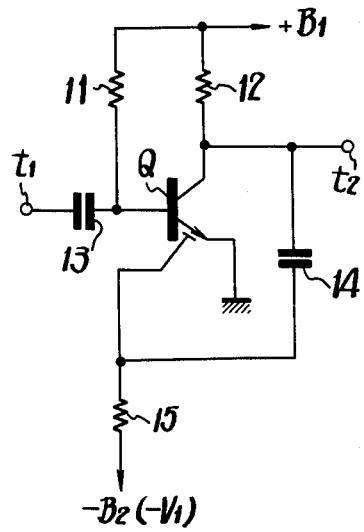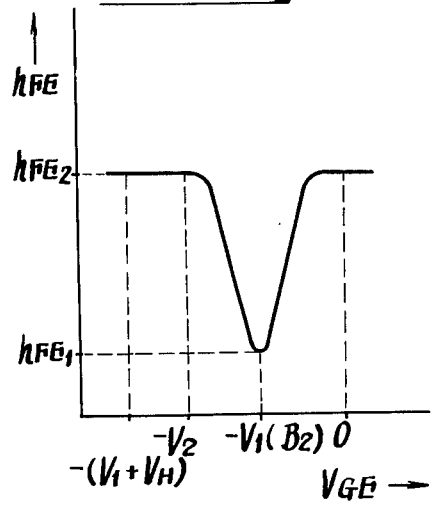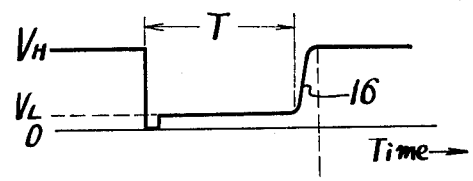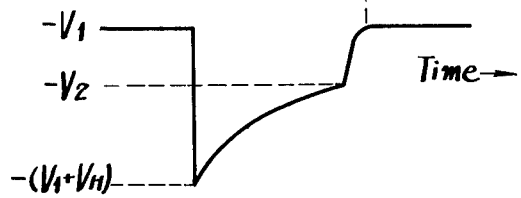

MONOSTABLE MULTIVIBRATOR

BACKGROUND OF THE INVENTION

Field of the Invention

The field of art to which this invention pertains is multivibrator circuits and in particular to multivibrator circuits utilizing a single semiconductor device.

SUMMARY OF THE INVENTION

It is the principal object of the present invention to provide an improved multivibrator circuit.

It is another feature of the present invention to provide a multivibrator circuit utilizing a novel four terminal semiconductor device having an emitter-grounded amplification characteristic which is generally V-shaped and for utilizing that characteristic as a means for producing a multivibrator action in response to a trigger signal.

It is the principal object of the present invention to provide a multivibrator circuit of the type as described above wherein the gate circuit of the novel four terminal semiconductor device is biased to a low point on the emitter-grounded current amplification characteristic and where the voltage of the gate is caused to shift, by the operation of a capacitor connected between the gate and the collector of the device, at the time of application of a trigger pulse to the base circuit thereof.

These and other objects, features and advantages of the present invention will be understood in greater detail from the following description and the associated drawings wherein reference numerals are utilized to designate a preferred embodiment.

BRIEF DESCRIPTION OF THE DRAWINGS

FIG. 6 is a schematic of a multivibrator circuit utilizing a four terminal semiconductor device according to the present invention.

FIG. 7 is a further illustration of an emitter-grounded current amplification characteristic of the device shown in FIG. 6 illustrating the various biased points used to produce the multivibrator action.

FIG. 8a is a waveform showing the nature of the trigger pulse applied to the base of the four terminal device of FIG. 6.

FIG. 8b is an illustration of the voltage output of the multivibrator circuit, and FIG. 8c is an illustration of the voltage as developed at the gate terminal of the semiconductor device in response to the application of a trigger signal as shown in FIG. 8a.

DESCRIPTION OF THE PREFERRED EMBODIMENTS

The present invention relates to a monostable multivibrator circuit using a novel four terminal semiconductor device where a trigger signal is applied to the base of the device and a charging circuit is connected between the gate and the collector in such a manner as to utilize the V-shaped emitter-grounded current amplification characteristic of the device beneficially for the use of producing a multivibrator action.

Figure 1:
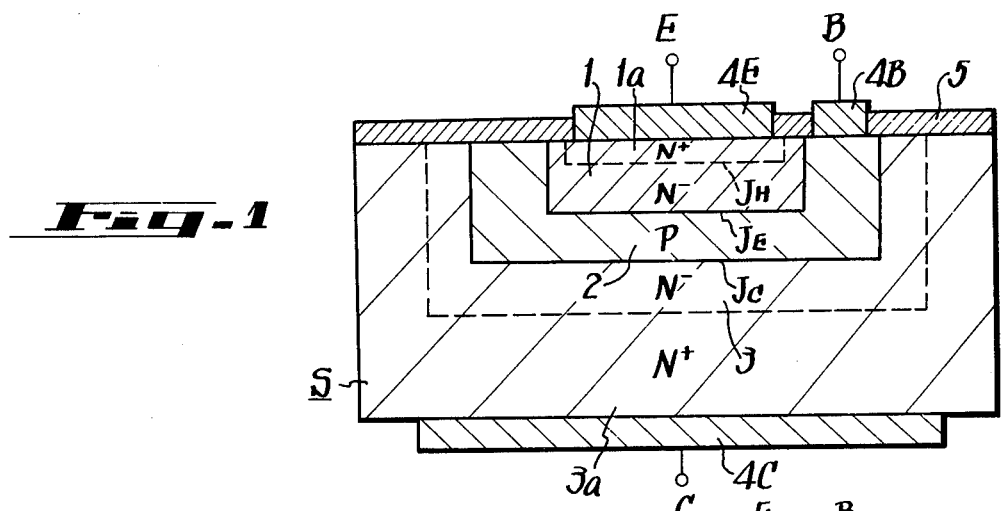
FIG. 1 is an illustration of a three terminal device which may form the basis for a four terminal device according to the present invention.
Figure 2:
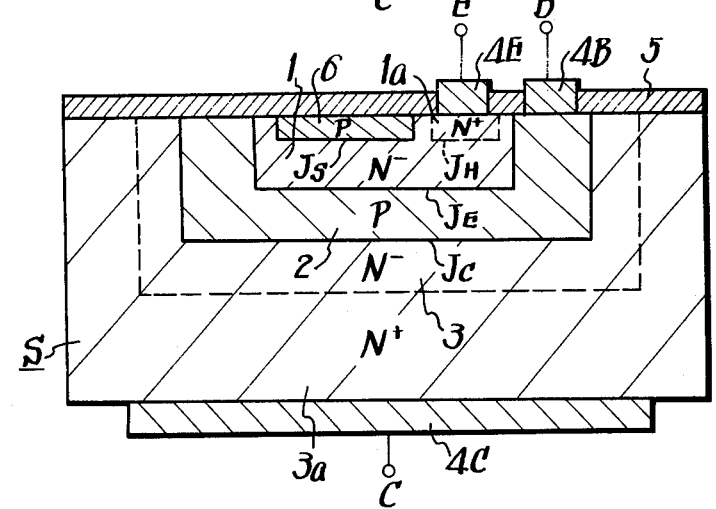
FIG. 2 is an illustration of an alternate form of a three terminal device similar to FIG. 1.
Figure 3:
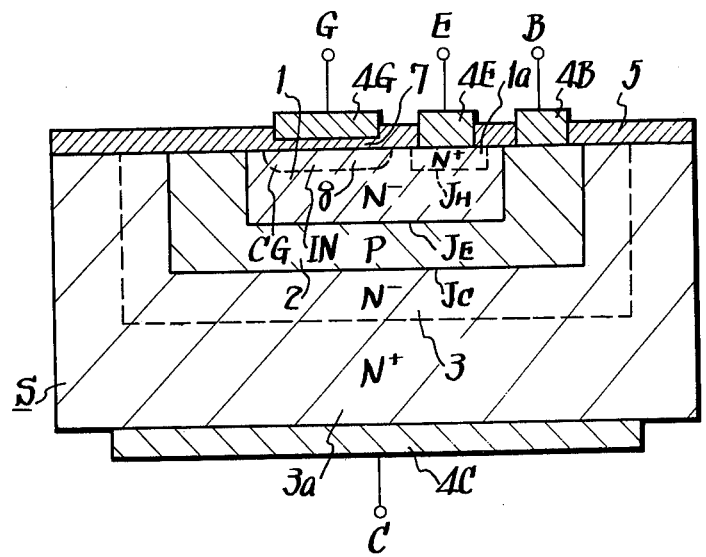
FIG. 3 is an illustration of a four terminal device according to the present invention which is useable in a circuit such as shown in FIG. 6.

Novel four terminal semiconductor devices, as shown in FIGS. 1, 2 and 3, have high current amplification factors, are good in saturation characteristic and have low noise as compared with a prior art bipolar transistor and is constituted by providing a fourth electrode additionally to a body of a novel semiconductor device of the three terminal type described below.

The emitter-grounded current amplification factor $h_{FE}$ of a transistor, which is one of parameters evaluating the characteristics of the bipolar transistor, can be expressed by the following equation (1), if the base-grounded current amplification factor of the transistor is taken as $\alpha$.

$$h_{FE} = \alpha/1 - \alpha \tag{1}$$

The factor is expressed as follows:

$$\alpha = \alpha^* \beta \gamma \tag{2}$$

where $\alpha^*$ repesents the collector amplification factor, $\beta$ the base transfer efficiency and $\gamma$ the emitter injection efficiency, respectively.

Now, if the emitter injection efficiency $\gamma$ of an NPN-type transistor is taken into consideration, $\gamma$ is given by the following expression (3).

$$\gamma = \frac{J_n}{J_n + J_p} = \frac{1}{1 + \frac{J_p}{J_n}} \tag{3}$$

where $J_n$ represents the current density of electrons injected from the emitter to the base of the transistor and $J_p$ the current density of holes injected from the base to the emitter of the transistor, respectively.

Since $J_n$ and $J_p$ are expressed by the following equations (4) and (5), respectively.

$$J_n = \frac{qD_n n_p}{L_n} \left\{ \exp\left(\frac{qV}{kT}\right)^{-1} \right\} \tag{4}$$

$$J_p = \frac{qD_p p_n}{L_p} - \left\{ \exp\left(\frac{qV}{kT}\right)^{-1} \right\} \tag{5}$$

the ratio $\delta$ of $J_n$ and $J_p$ is expressed as follows:

$$\delta = \frac{J_p}{J_n} = \frac{L_n D_p}{L_p D_n} \cdot \frac{p_n}{n_p} \tag{6}$$

where $L_n$ represents the diffusion distance of the minority carriers in the base of the transistor; $L_p$ the diffusion distance of the minority carriers in the emitter of the transistor; $D_n$ the diffusion constant of the minority carriers in the base; $D_p$ the diffusion constant of the minority carriers in the emitter; $n_p$ the concentration of the minority carriers in the base under the equilibrium state; $p_n$ the concentration of the minority carries in the emitter under the equilibrium state; V a voltage applied to the emitter junction of the transistor; k the Boltzmann's constant; T temperature and q the absolute value of electron charge.

If it is assumed that the impurity concentration in the emitter of the transistor is taken as $N_D$ and that in the base of the transistor taken as $N_A$, the term pn/np can be replaced by the term $N_A/N_D$. Further, since $L_n$ is restricted by the base width W and $L_n = W$, the ratio $\delta$ is expressed as follows:

$$= \frac{W}{L_p} \cdot \frac{D_p}{D_n} \cdot \frac{N_A}{N_D} \qquad (7)$$

The diffusion constants $D_n$ and $D_p$ are functions of transfer of the carrier and temperature and in this case they are assumed constant substantially.

As may be obvious from the above respective equations, in order to increase the current amplification factor $h_{FE}$ of a transistor, it is sufficient to make the ratio $\delta$ small.

Therefore, in an ordinary transistor, the impurity concentration $N_D$ of its emitter is selected high enough so as to make the ratio $\delta$ small.

However, if the impurity concentration of the emitter is selected sufficiently high, for example, more than $10^{19}$ atom/cm³, lattice defects and dislocation occur in the crystal of the semiconductor body of the transistor to deteriorate the crystal. Further, due to the fact that the impurity concentration of the emitter itself is high, a life time $\tau_p$ of the minority carriers injected to the emitter from the base becomes short.

Since the diffusion distance $L_p$ is expressed by the following equation (8)

$$L_p = D_p \tau_p \qquad (8)$$

the diffusion distance $L_p$ of the minority carriers or holes becomes short. Therefore, as may be apparent from the equation (7), $\delta$ cannot be made small so much and hence the injection efficiency $\gamma$ cannot be made high over a certain value. As a result, the current amplification factor $h_{FE}$ cannot be made high so much in the ordinary transistor.

The novel three terminal semiconductor device is free from the defects mentioned just above inherent to the prior art transistor. As the semiconductor device used in this invention, an NPN-type one and a PNP-type one could be considered as in the case of the prior art transistor, but an NPN-type semiconductor device will be now described with reference to FIGS. 1 and 2, by way of example.

As shown in FIG. 1, the NPN-type three terminal semiconductor device consists of a first semiconductor region 1 of N⁻ type conductivity formed in a semiconductor substrate S of N⁺ type conductivity, a second semiconductor region 2 of P type conductivity formed in the semiconductor substrate S adjacent the first region 1, and a third semiconductor region 3 of N⁻ type conductivity formed in the substrate S adjacent the second region 2 to form a first PN-junction $J_E$ between the first and second regions 1 and 2 and a second PN-junction $J_c$ between the second and third regions 2 and 3, respectively.

With the semiconductor device shown in FIG. 1, at the position facing the first junction $J_E$ and apart from it by a distance smaller than the diffusion distance $L_p$ of the minority carriers or holes injected from the second region 2 to the first region 1, a potential barrier having energy higher than that of the minority carriers or holes, or at least heat energy is formed in the first region 1. In the example of FIG. 1, the impurity concentration in the first region 1 is selected low sufficiently such as in the order of $10^{15}$ atoms/cm³ and region 1a of N⁺ type conductivity or the impurity concentration of about $10^{19}$ atom/cm³ is formed in the first region 1 to form an LH-junction and hence to form the barrier.

The impurity concentration in the second region 2 is selected in the order of $10^{15}$–$10^{17}$ atom/cm³ and that in the third region 3 is selected sufficiently low such as in the order of $10^{15}$ atom/cm³.

In the semiconductor substrate S adjacent to the third region 3 but apart from the second junction $J_c$, there is formed a region 3a of N⁺ type conductivity and with the impurity concentration of about $10^{19}$ atom/cm³.

A first electrode 4E is formed on the high impurity concentration region 1a in the region 1 in ohmic contact therewith; a second electrode 4B is formed on the second region 2 in ohmic contact therewith; and a third electrode 4C on the high impurity concentration region 3a adjacent the third region 3 in ohmic contact therewith, respectively. From these electrodes 4E, 4B and 4C there are led out first, second and third terminals E, B and C, respectively. In FIG. 1, reference numeral 5 indicates an insulating layer made of, for example, SiO₂ and formed on the surface of the substrate S.

The semiconductor device shown in FIG. 1 can be used as a transistor. In such a case, the first region 1 serves as an emitter region; the second region 2 as a base region; and the third region 3 as a collector region, respectively, a forward bias is applied to the emitter junction $J_E$ and a reverse bias in applied to the collector junction $J_C$.

Thus, the holes injected from the base or the second region 2 to the emitter or first region 1 have a long life period of time due to the fact that the emitter region 1 has the low impurity concentration and good crystal property, and hence the diffusion distance $L_p$ of the holes in the emitter region 1 becomes long. As a result, as may be apparent from the equations (6) and (3), the emitter injection efficiency $\gamma$ can be made high. However, in the case that the diffusion distance $L_p$ is made long, if the injected holes into the emitter region 1 may arrive at the surface of the substrate S and may be recombined with electrons on the surface in practice, the diffusion distace $L_p$ could not be made long substantially. With the semiconductor device shown in FIG. 1, since the potential barrier is formed in the emitter region 1, which potential barrier faces the emitter junction $J_E$, at the position with a distance smaller than the diffusion distance $L_p$ of the minority carrier, the amount of the surface-recombination is reduced and the diffusion distance $L_p$ can be taken long sufficiently.

Due to the fact that the potential barrier is formed as described above in the example shown in FIG. 1, there is performed such an effect that the current density or component $J_p$ of the holes injected from the base region 2 to the emitter region 1 is reduced. That is, on the LH-injection $J_H$ in the emitter region 1, there is causes a false Fermi level difference or built-in electric field which acts to suppress the diffusion of the holes or the minority carrier. Therefore, if the level of the Fermi level is sufficiently high, the diffusion current caused by the concentration gradient of holes and the drift current caused by the built-in electric field are cancelled on the LH-junction with each other to reduce the hole current $J_p$ injected from the base 2 through the emitter region 1 of low impurity concentration. By this effect, the ratio of electron current arriving at the collector region 3 relative to current component passing through the emitter junction $J_E$ is increased and hence the emitter injection efficiency $\gamma$ is increased as apparent from the equation (3) to make the current amplification factor $h_{FE}$ high.

The above level difference (the height of the potential barrier) must be more than the energy of holes or at least the heat energy. The heat energy can be approximated as kT but the above level difference is desired to be more than 0.1 eV. With in the transition region of the potential, the diffusion distance $L_p$ of the holes must be not terminated within the transition region, or it is required that the diffusion distance $L_p$ of the hole must be greater than the width of the transition region.

In the case that LH-junction $J_H$ is formed as shown in FIG. 1, the potential barrier of 0.2 eV can be formed by suitably selecting the amount of impurity and gradient of the high impurity concentration region 1a.

FIG. 2 shows another example of the three terminal semiconductor device in which reference numerals and letters same as those used in FIG. 1 indicate the same elements so that their description will be omitted.

In the example of FIG. 2, in order to form a PN-junction $J_S$ facing the first or emitter junction $J_E$, an additional region 6 of P type conductivity is formed in the first region 1. In the example of FIG. 2, the distance between the junctions $J_S$ and $J_E$ is selected smaller than the diffusion distance $L_p$ of the minority carrier in the first region 1. The other construction of the example shown in FIG. 2 is substantially same as that of the example shown in FIG. 1.

With the example of FIG. 2, since the diffusion distance $L_p$ of the hole injected to the first region 1 is long as described above, the hole arrives at the additional region 6 effectively and then is absorbed thereby. When the additional region 6 is floated from electrical point of view, its potential is increased as the number of holes arriving at the additional region 6 is increased. Thus, the PN junction $J_S$ formed between the regions 6 and 1 is biased forwardly to its rising-up voltage substantially, and then holes will be re-injected to the first region 1 from the additional region 6. Thus, the concentration of holes in the first region 1 near the additional region 6 will be increased, and accordingly the concentration distribution of holes between the junctions $J_E$ and $J_S$ in the first region 1 is made uniform and the gradient thereof becomes gradual to reduce the diffusion current $J_p$ from the second region 2 to the first region 1.

If, in the semiconductor devices described above, a fourth region or control region is formed in the first region 1 thereof and a fourth electrode or control electrode (gate) is connected thereto so as to form a novel four terminal semiconductor device its current amplification factor may be varied by applying a control voltage to the control electrode (gate).

A description will be now given on the novel four terminal semiconductor device which is suitable for use in the invention with reference to FIG. 3 in which a control electrode (gate) is formed on a surface of a part (semiconductor control region) of the first semiconductor region 1 (emitter region) of the semiconductor device of the three terminal type shown in FIG. 1 through an insulating layer. Therefore, in FIG. 3, elements corresponding to those of FIG. 1 are shown by the same reference numerals and letters and their description will be omitted for the sake of brevity.

In the embodiment of FIG. 3, a control electrode 4G such as a metal layer made of, for example, aluminium and having a predetermined area is formed on a part of the first semiconductor region (emitter region) 1 of the device shown in FIG. 1 through an insulating layer (gate insulating layer) 7 which has a predetermined thickness, for example, 100 A (angstrom), and is made of, for example, $SiO_2$ similar to the insulating layer 5, and corresponds to the gate insulating layer of a MOS FET. A gate terminal G is led out from the control electrode 4G as a fourth terminal. A part 8 in the first region 1 opposing the control electrode 4G is the semiconductor control region.

If a gate bias voltage is applied between the gate and emitter of the four terminal semiconductor device or the gate terminal G and the emitter terminal E, the current amplification factor or emitter-grounded current amplification factor $h_{FE}$ thereof is varied in response to the gate bias voltage along a curve which is convex in the downward direction and substantially symmetrical with respect to its minimum value. In other words, if a bias voltage which is negative relative to the emitter terminal E in the device of FIG. 3, within the positive range from the threshold voltage of the bias voltage, a storage layer CG having the function similar to the LH-junction $J_H$ as the potential barrier in FIG. 1 is formed in a part of the first region (emitter region) 1 as the voltage approaches the positive direction. Thus, the current density $J_p$ of the holes of the diffusion current from the second region (base region) 2 to the first region (emitter region) 1 decreases, and consequently the factor $h_{FE}$ increases.

While, within the negative region from the threshold voltage of the bias voltage, an inverse layer IN is formed in a part of the emitter region 1 or control region 8 as the voltage approaches the negative direction and, similar to the case where the additional region 6 in FIG. 2 is floated in electrical point of view, holes are re-injected from the inverse layer IN to the emitter region 1. Thus, the current density $J_p$ of the holes of the diffusion current from the base region 2 to the emitter region 1 decreases, and consequently the factor $h_{FE}$ increases.

Figure 4:
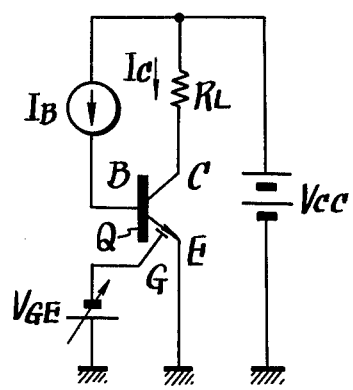
FIG. 4 is a test circuit used for producing an emitter-grounded current amplification characteristic curve as shown in FIG. 5.
Figure 5:
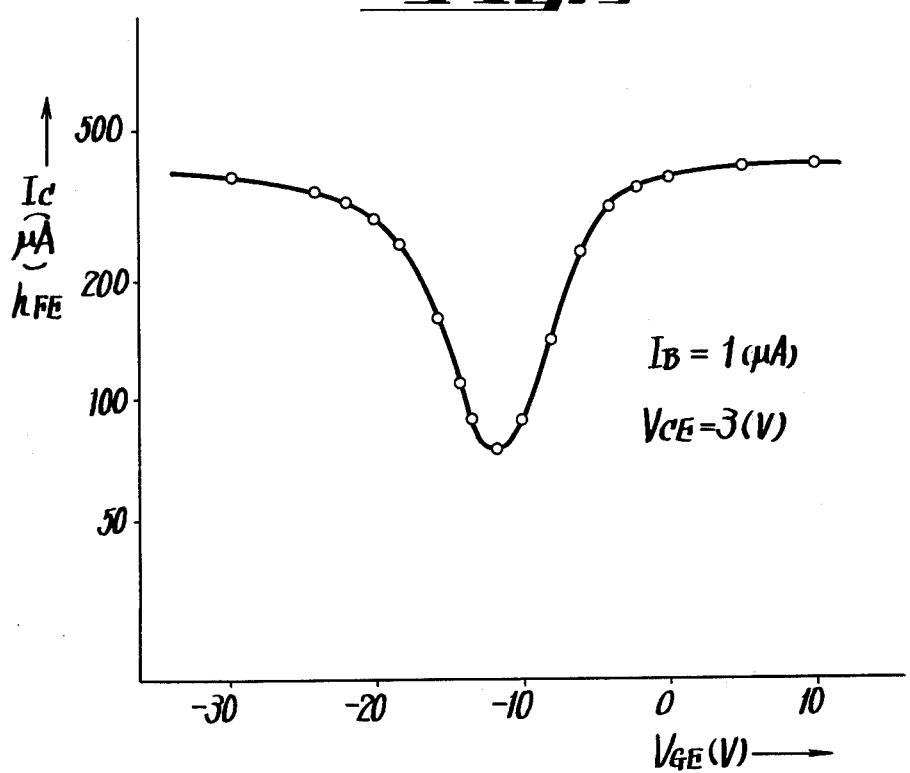
FIG. 5 is an emitter-grounded current amplification characteristic of a four terminal semiconductor device according to the present invention as produced in the circuit of FIG. 4.

FIG. 5 is a graph showing the characteristics of the novel four terminal semiconductor device shown in FIG. 3 which is measured by a measuring circuit shown in FIG. 4.

In FIG. 4, reference letter Q indicated the novel four terminal semiconductor device shown in FIG. 3 as a symbol, in which a short line is added to the symbol of the prior art bipolar transistor in parallel to its emitter as the gate of the novel four terminal semiconductor device Q. In FIG. 4, the novel four terminal semiconductor device Q is shown as an emitter-grounded type. In the figure, reference letter $R_L$ indicates a collector load resistor of the device Q, $V_{CC}$ its collector voltage source, $I_C$ its collector current, $I_B$ its base current (constant), and $V_{GE}$ its gate-emitter voltage, respectively.

When its collector-emitter voltage $V_{CE}$ is 3V (volts) and the base current $I_B$ is 1 $\mu A$ (micro-ampere), the characteristics of the gate-emitter voltage (gate bias voltage) $V_{GE}(V)$ - collector current $I_C(\mu A)$ and emitter-grounded current amplification factor $h_{FE}$ are shown in the graph of FIG. 5.

According to the characteristic curve of FIG. 5, it may be understood that the current amplification factor $h_{FE}$ is varied in response to the variation of the gate bias voltage along a curve which is convex in the downward direction and approximately symmetrical with respect to its minimum value (where the gate-emitter voltage is at the above threshold voltage).

When the thickness of the emitter region 1 of the semiconductor device shown in FIG. 3 is selected smaller than the diffusion distance $L_p$ of the holes (injected carriers), the surface recombination, where the gate-emitter voltage $V_{GE}$ is substantially equal to the threshold voltage, influences much. Thus, the life time period of the injected carrier (minority carrier) becomes short, and accordingly the minimum value of the factor $h_{FE}$ can be made small further.

The embodiment shown in FIG. 3 is an NPN type element, but it may be, of course, possible that the semiconductor device is made as a PNP type one as in the case of a bipolar transistor.

In FIG. 6 a schematic of a multivibrator circuit according to the present invention is illustrated. Here, the semiconductor device of the present invention is designated by the letter Q. The device has a gate terminal which is connected through a resistor 15 to a B− supply as shown. The emitter of the device is grounded as shown. The collector is connected through a resistor to a B+ supply, and the B+ is connected through a further resistor 11 to provide bias for the base of the device. The base is connected through a blocking capacitor 13 to a terminal $t_1$ which receives the trigger signal. The collector is also connected to an output terminal $t_2$ which develops the desired output voltage. A capacitor 14 interconnects the output terminal $t_2$ with the gate and provides the vital charging and discharging function to produce the multivibrator action by shifting the gate voltage as described.

Referring now to FIG. 7 and 8a, 8b and 8c, the point $-V_1$ in FIG. 7 corresponds to the voltage $-B_2$ of FIG. 6. After the trigger pulse shown in FIG. 8a is applied to $t_1$, the semiconductor device is made fully conductive which immediately lowers the voltage at the output terminal $t_2$. This grounding of the voltage at $t_2$ then causes a shift in the voltage of the gate to a point in FIG. 7 corresponding to $-(V_1 + V_h)$. This is shown in FIG. 8c as a sharp vertical line extending from the point $-V_1$ to the point $-(V_1 + V_h)$.

The capacitor 14 then begins its discharge cycle producing a voltage change as shown by the curved line in FIG. 8c. Essentially, the gate voltage is then returning by the discharge of the capacitor 14 to the level $-V_1$. As it approaches $-V_2$ the emitter-grounded current amplification factor changes rapidly from a high level to a low level greatly reducing the conduction of the semiconductor device Q and causing the output voltage to rise rapidly along the curved line 16 in FIG. 8b. This completes the cycle of the multivibrator action. The cycle then repeats itself with the coming of a new trigger pulse as shown in FIG. 8a.

I claim as my invention:

1. A monostable multivibrator circuit comprising:
    a semiconductor device having a first semiconductor region of one conductivity type,
    a second semiconductor region of the opposite conductivity type adjacent said first region with a first semiconductor junction therebetween,
    a third semiconductor region of the same conductivity type of said first region adjacent said second region with a second semiconductor junction therebetween, first, second and third terminals coupled to said first, second and third regions, respectively;
    a fourth terminal connected to said semiconductor device and having at least a portion thereof located adjacent said first region at a position which is spaced from the said first terminal, and an insulating layer separating said fourth terminal from said first region,
    an emitter grounded current amplification of said device being adjustable from a relatively high value to a relatively low value by changing a voltage on said fourth terminal,
    means for applying a trigger signal to the second terminal of said semiconductor device,
    a circuit branch containing a capacitor, which branch connects the third and fourth terminals,
    a predetermined bias being applied to said fourth terminal which is chosen such that in the absence of the trigger signal and in a steady state condition said current amplification is substantially at said relatively low value,
    means for applying a power source across said first and third terminals of said device, and
    second means coupled to said second terminal for biasing said device into a conducting state when said current amplification is substantially at said relatively high value.

2. A circuit in accordance with claim 1 wherein said device is operated as an emitter grounded four terminal device and an impedance is disposed in series with said predetermined bias.

3. A circuit in accordance with claim 1 wherein said second means causes said device to develop a steady state voltage across said first and third terminals, said trigger signal being a pulse having a substantially higher value than said second means and causing said device to operate at a relatively high level resulting in a sharply reduced voltage across said first and third terminals, whereby said fourth terminal voltage is shifted by the operation of said capacitor to a value which places the emitter grounded amplification characteristic of said device at a relatively high level.

4. A circuit in accordance with claim 3 wherein the discharge time of said capacitor is less than the period of repetition of the trigger signal.

5. A circuit in accordance with claim 1, wherein said first and third regions of the semiconductor device each have at least a first portion concentrations of substantially the same order of magnitude, said first region being provided with a second portion having an impurity concentration higher than said first portion of the first region at a position spaced from said first junction by a distance which is smaller than the diffusion distance of the minority carriers, and said fourth terminal comprising a gate electrode which overlies only said first region.

* * * * *